United States Patent [19]

Carson et al.

[11] Patent Number: 5,705,855

[45] Date of Patent: Jan. 6, 1998

[54] INTEGRATED CIRCUIT FOR DIRECTLY ATTACHING TO A GLASS SUBSTRATE AND METHOD FOR MANUFACTURING THE SAME

[75] Inventors: Robert Thomas Carson, Lantana; Lisa Reckleben, Boynton Beach; Dawn He Zhong, Lake Worth; Arnold William Hogrefe, Jr., Ft. Lauderdale; Scott Lawrence Joslin, Boca Raton, all of Fla.

[73] Assignee: Motorola, Inc., Schaumburg, Ill.

[21] Appl. No.: 709,421

[22] Filed: Sep. 6, 1996

Related U.S. Application Data

[63] Continuation of Ser. No. 372,481, Jan. 13, 1995, abandoned.

[51] Int. Cl.$^6$ .............................. H01L 23/48; H05K 7/02
[52] U.S. Cl. .......................... 257/737; 257/783; 257/668; 361/760
[58] Field of Search ...................... 257/737, 738, 257/773, 778, 780, 692; 361/760, 772, 773, 779, 783

[56] References Cited

U.S. PATENT DOCUMENTS

| | | | |
|---|---|---|---|
| 5,329,423 | 7/1994 | Scholz | 257/738 |
| 5,384,952 | 1/1995 | Matsui | 29/840 |
| 5,393,696 | 2/1995 | Koh et al. | 437/183 |

OTHER PUBLICATIONS

"Electronic Packaging and Interconnection Handbook"; pp. 1.40–1.41; C. Harper.

*Primary Examiner*—Mahshid D. Saadat
*Assistant Examiner*—Jhihan B. Clark
*Attorney, Agent, or Firm*—Kelly A. Gardner

[57] ABSTRACT

An integrated circuit (230) for attaching to a glass substrate (225) includes an integrated circuit die (350) having circuitry formed thereon. The integrated circuit (230) has cavities (380) formed in a first surface, and metal layers (370) formed adjacent to the integrated circuit die (350) and within the cavities (380) are coupled to the circuitry. Conductive bumps (260), which are formed from a material that adheres to glass, are deposited within the cavities (380) and electrically coupled to the circuitry via the metal layers (370).

11 Claims, 5 Drawing Sheets

INTEGRATED CIRCUIT FOR DIRECTLY ATTACHING TO A GLASS SUBSTRATE AND METHOD FOR MANUFACTURING THE SAME

This is a continuation of application Ser. No. 08/372,481, filed Jan. 13, 1995 and now abandoned.

FIELD OF THE INVENTION

This invention relates in general to methods for attaching components to substrates, and more specifically to a method for attaching an integrated circuit to a glass substrate.

BACKGROUND OF THE INVENTION

Many electronic devices, such as portable radio communication devices, include displays for presenting received information to a user. One type of display that can be utilized is a liquid crystal display (LCD), which includes glass substrates between which liquid crystal material is deposited in a manner known to one of ordinary skill in the art. Within an electronic device, an LCD is customarily attached to a printed circuit board on which device circuitry is mounted. The device circuitry includes circuitry for generating information that is to be displayed to the user and LCD driving circuitry for receiving the information and generating display signals that are provided to the LCD. The LCD can be coupled to the printed circuit board for receiving the display signals by a heat seal connector or by a flexible substrate, either of which includes conductive runners coupled to the LCD and the printed circuit board.

In such embodiments, large amounts of space are consumed on the printed circuit board both for placement of the LCD driving circuitry and for accommodation of a great number of runners for providing signals from the LCD driving circuitry. Additionally, for each runner providing a signal from the LCD driving circuitry, a contact must be formed on the printed circuit board for contacting the heat seal connector or the flexible substrate coupled to the LCD. These contacts further consume space on the printed circuit board.

In smaller electronic devices, such as paging receivers, spacing issues are critical because the portable paging receivers are being miniaturized on an on-going basis for the purpose of providing smaller, lighter devices. The large amount of space required on the printed circuit board for placement of driving circuitry and formation of runners and contacts is therefore incompatible with the goal of miniaturization.

Thus, what is needed is a method for providing LCD driving circuitry that utilizes a smaller amount of space on the printed circuit board of an electronic device having a display.

SUMMARY OF THE INVENTION

A method for electrically coupling an integrated circuit (IC) to a glass substrate comprises the step of forming conductive bumps on a first surface of the IC, wherein the conductive bumps comprise a material that adheres to glass. The IC is positioned on the glass substrate such that the conductive bumps contact conductive runners formed on the glass substrate, and the conductive bumps of the IC are heated such that the conductive bumps liquefy and adhere to the glass substrate, thereby electrically coupling the conductive bumps to the conductive runners.

An integrated circuit for attaching to a glass substrate includes an integrated circuit die having circuitry formed thereon. The integrated circuit has cavities formed in a first surface, and metal layers formed adjacent to the integrated circuit die and within the cavities are coupled to the circuitry. Conductive bumps, which are formed from a material that adheres to glass, are deposited within the cavities and electrically coupled to the circuitry via the metal layers.

DESCRIPTION OF A PREFERRED EMBODIMENT

Figure 1:
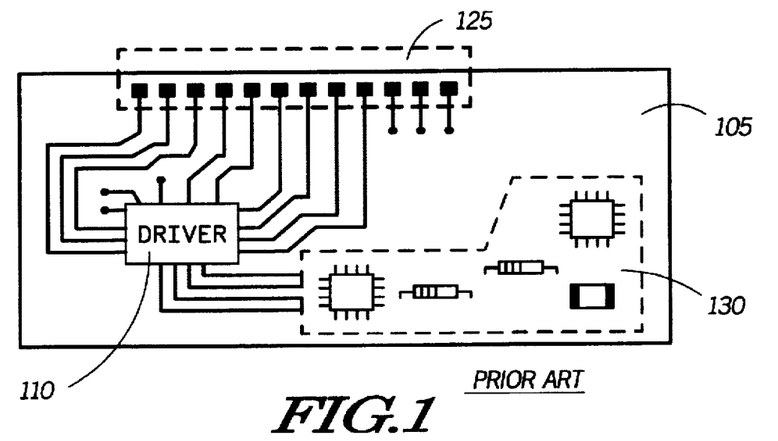
FIG. 1 is an illustration of a printed circuit board having a liquid crystal display (LCD) driver and device circuitry mounted thereon in a conventional manner.
Figure 2:
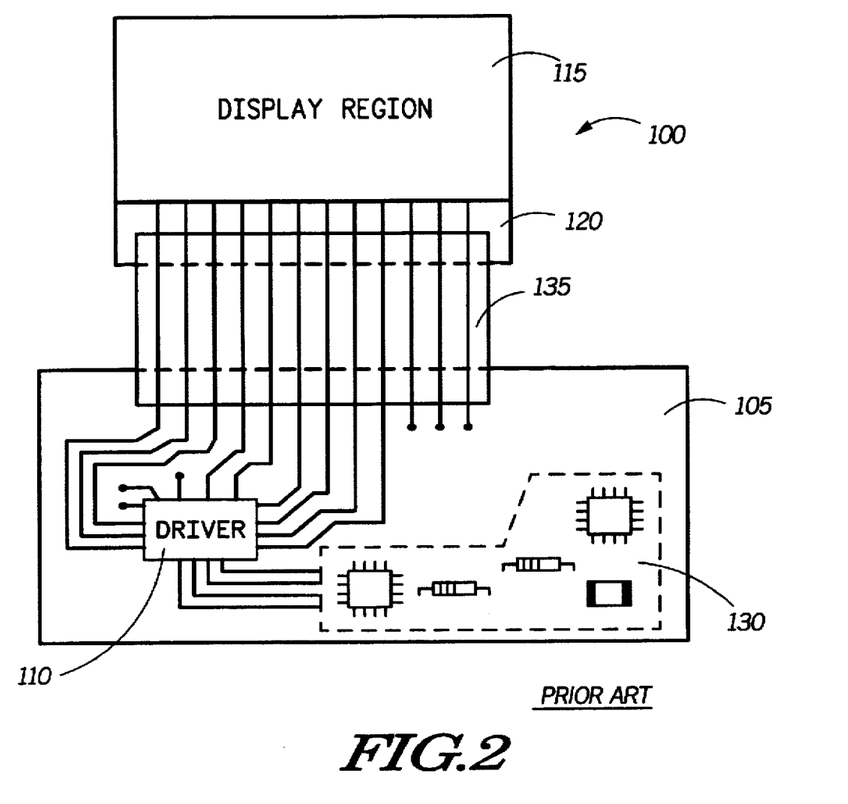
FIG. 2 is an illustration of the connection of the printed circuit board of FIG. 1 to an LCD by a connector in a conventional manner.

FIGS. 1 and 2 are top views of a conventional printed circuit (pc) board 105 (FIG. 1) and the attachment thereto of a display, such as a liquid crystal display 100 (FIG. 2) on which display driving circuitry is mounted. The display driving circuitry can be, for example, a driver chip 110 formed in integrated circuitry. The liquid crystal display (LCD) 100 includes a display region 115 for presenting information to a user and an extended glass region 120 on which conductive pads (not shown) are formed. Conductive pads 125, equal in number to the pads formed on the extended glass region 120 of the LCD 100, are formed on the board 105.

Conventionally, device circuitry 130 mounted on the pc board 105 generates data signals associated with information that is to be displayed on the LCD 100. The data signals are provided via conductive runners formed on the board 105 to incoming ports of the driver 110 for processing thereby to generate display signals. The display signals are provided at outgoing ports of the driver 110, and other conductive runners formed on the pc board 105 provide the display signals from the driver 110 to the conductive pads 125 formed on the pc board 105.

The conductive pads 125 of the pc board 105 are electrically coupled to the conductive pads of the extended glass region 120 by a conventional connector 135, such as a flexible substrate or a heat seal connector, on which runners are formed. The display signals are provided via the connector 135 to the LCD 100 to drive the display region 115 thereof for presentation of the information to the user in a manner known to one of ordinary skill in the art.

Typically, the driver 110 utilizes a relatively small number of incoming data signals to produce a large number of display signals, which drive each column and each row of the LCD 100. It will be appreciated that the number of display signals increases as the size of the LCD 100 increases. As a result, the driver 110, the runners for providing the display signals; and the conductive pads 125 can consume quite a large amount of space. This is very undesirable in some electronic devices, such as portable radio communication devices that must be small and lightweight to attract consumers.

Figure 3:
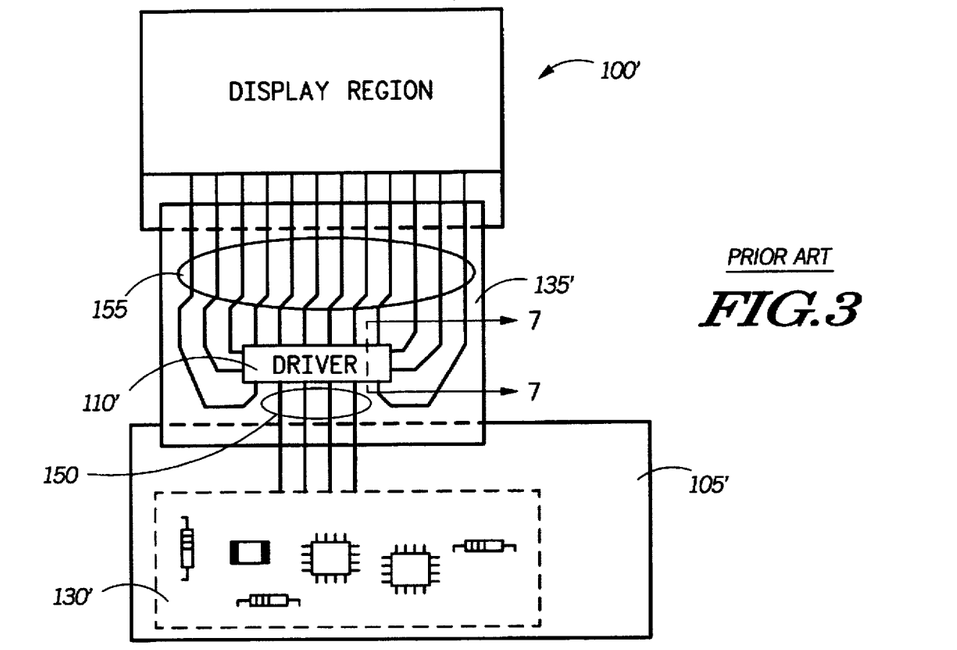
FIG. 3 is an illustration of an LCD coupled to a printed circuit board by a connector on which an LCD driver is mounted in a conventional manner.

FIG. 3 is an illustration of another conventional method for placement of driving circuitry and connection of an LCD 100' to a pc board 105'. As shown, device circuitry 130' is mounted to the pc board 105' to generate data signals, which are provided to pads (not shown) on the pc board 105'. A connector 135' is coupled to the pads on the pc board 105', and the driver 110' is mounted to the connector 135' rather than to the pc board 105'. The signals received from the device circuitry 130' are provided to the driver 110' by a first plurality of conductive runners 150 formed on the connector 135'. The display signals generated by the driver 110' are provided to the LCD 100' by a second plurality of conductive runners 155 formed on the connector 135'. In this manner, space can be saved within an electronic device because the connector 135' is often flexible, such as when the connector 135' comprises a heat seal connector or flexible substrate, and can therefore be folded within the electronic device. However, solving the space problems that exist in smaller devices in this manner sometimes results in unreliable performance because the folding of the connector 135' can break electrical connections between runners and the driver 110'.

Figure 4:
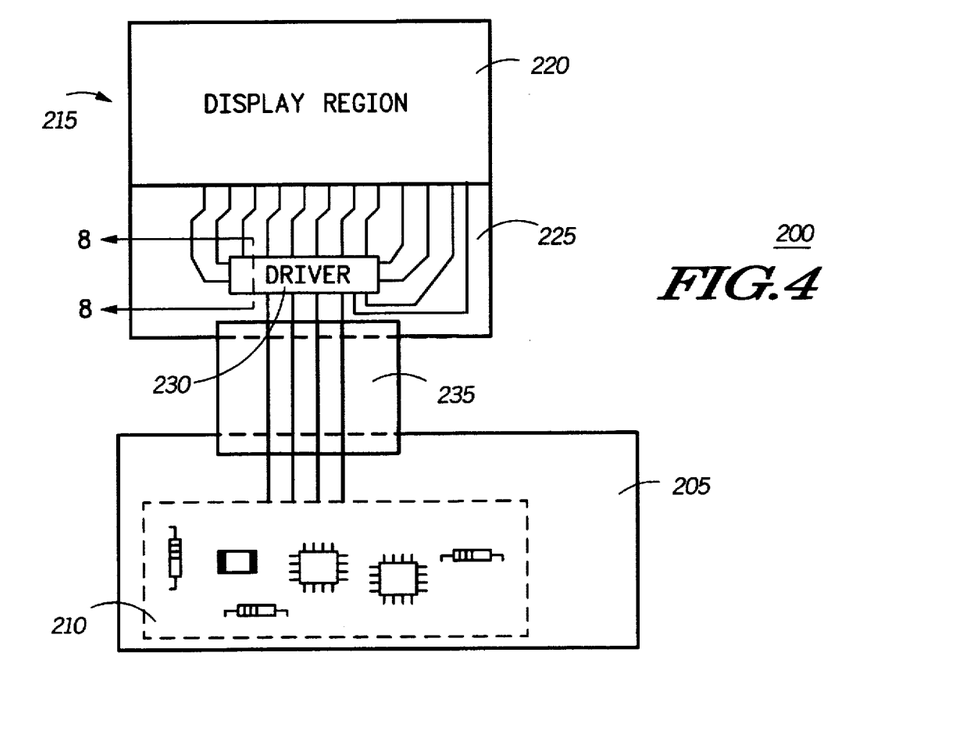
FIG. 4 is a top plan view of a printed circuit board coupled to an LCD on which an integrated circuit (IC) is mounted in accordance with the present invention.

FIG. 4 is a top plan view of an electronic device 200, such as a portable radio communication device, in accordance with the present invention. The electronic device 200 comprises a pc board 205, on which device circuitry 210 is mounted, and a display, such as an LCD 215. The LCD 215 comprises a display region 220 for displaying information and an extended glass region, i.e., a glass substrate 225, extending therefrom. According to the present invention, LCD driving circuitry, which can be in the form of an integrated circuit (IC) display driver 230, is mounted directly on the glass substrate 225 of the LCD 215. A connector 235, such as a flexible substrate or a heat seal connector, electrically couples the pc board 205 to the LCD 215 to provide data signals generated by the device circuitry 210 to the incoming ports of the driver 230. The data signals are preferably utilized by the driver 230 for the generation of display signals for driving the LCD 215 to produce information to be presented on the display region 220 thereof.

Figure 5:
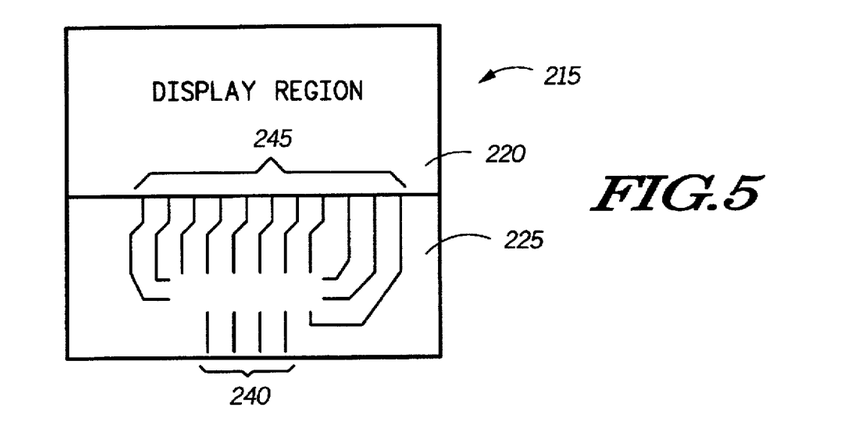
FIG. 5 is a top plan view of the LCD of FIG. 4 in accordance with the present invention.

Referring next to FIG. 5, a top plan view of the LCD 215 is depicted. In accordance with the present invention, as described above, the extended glass region extends from the display portion 220 to create a glass substrate 225 having sufficient area for the placement of an integrated circuit (IC) display driver 230 (FIG. 4). Formed on the glass substrate 225 are a first plurality of conductive runners 240 for receiving the data signals provided over the connector 235 (FIG. 4) and a second plurality of conductive runners 245 for providing the display signals to the display region 220 of the LCD 215. The first and second pluralities of runners 240, 245 are preferably formed from an indium tin oxide (ITO) alloy and arranged such that, when the driver 230 is placed on the glass substrate 225, the leads thereof contact the first and second pluralities of runners 240, 245 in predetermined locations.

Because, in accordance with the present invention, the driver 230 can be mounted directly to the glass substrate 225 of the LCD 215, the pc board 205 (FIG. 4) coupled to the LCD 215 can be smaller than conventional pc boards 105 (FIG. 2), which are required to accommodate the driver 110 as well as device circuitry 130. Although, according to the present invention, the glass substrate 225 of the LCD 215 has been extended farther than in conventional LCDs 100, 100' to accommodate the driver 230, ITO runners, such as the runners 240, 245, formed on glass can be formed at a smaller pitch so that runners formed on glass consume less space than runners formed on a pc board, a heat seal connector, or a flexible substrate. As a result, the placement of the driver 230 on the glass substrate 225 of the LCD 215 requires less space within the electronic device 200 (FIG. 4) than would placement of the same size driver on the pc board 205 or connector 235 of the electronic device 200. Smaller devices, such as portable radio devices, can therefore include larger LCDs and drivers therefore consistent with miniaturization goals within the communication industry.

Figure 6:
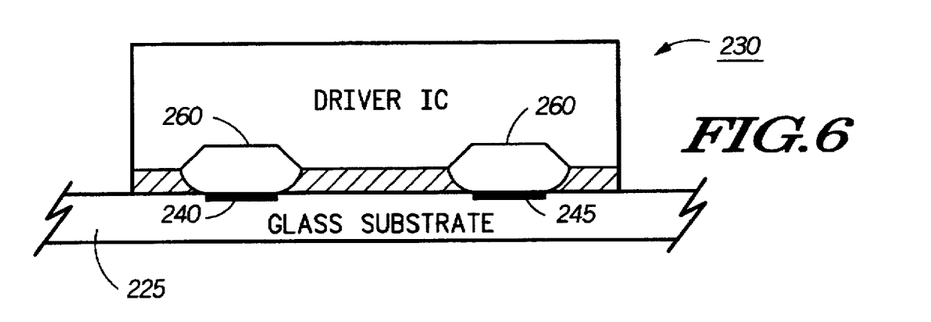
FIG. 6 is a side view of the IC of FIG. 4 when coupled to the glass substrate of the LCD of FIG. 4 in accordance with the present invention.

FIG. 6 is a side view of the driver 230 mounted to the glass substrate 225 of the LCD 215. Preferably, the driver 230 comprises an IC, as shown, which is electrically coupled to the runners 240, 245 formed on the substrate 225 via conductive bumps 260. Formation of the conductive bumps 260 according to the present invention will be explained in greater detail below.

Figure 7:
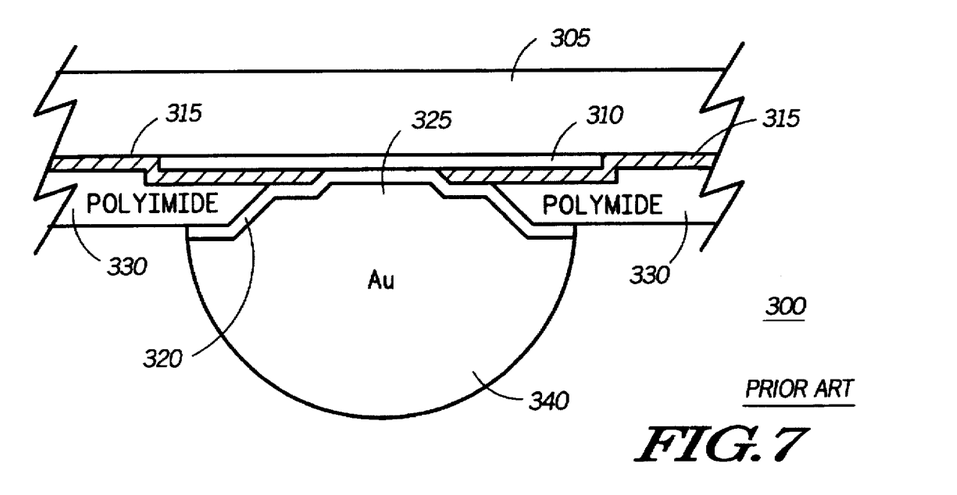
FIG. 7 is a side cutaway view of a conventional IC.

FIG. 7 is a side cutaway view of an IC 300 manufactured according to conventional integrated circuit fabrication techniques, such as a controlled-collapse-chip-connection (C4) technique. The IC 300 comprises an integrated circuit die 305. A redistribution layer 310, formed from a conductive material such as aluminum, is plated on a surface thereof to provide electrical connections to the circuitry (not shown) therein at appropriate locations. A conventional passivation layer 315 covers all but a selected region of the redistribution layer 310. Next, a metal layer 320, comprising successive layers of several different metals, is formed to create a cavity 325 in the surface of the IC 300. The metal layer 320 contacts the redistribution layer 310 in the selected region that is not covered by the passivation layer 315 to conduct signals from the electrical circuitry of the IC 300. A protective material 330, usually polyimide, is located between the metal layer 320 and the passivation layer 315 in the areas surrounding the defined cavity 325. Thereafter, a conductive reflowable bump 340 is electroplated or sputtered onto the metal layer 320 in the cavity 325 of the IC 300. The conductive bump 340, along with other conductive bumps (not shown) plated in other cavities of the IC, is typically manufactured from a material, such as gold, that will adhere to a solder when liquefied. The IC 300 is thereafter positioned on a substrate (not shown) and subjected to a reflow process in which the conductive bump 340 and other conductive bumps are electrically coupled to solder-coated pads of the substrate.

Figure 8:
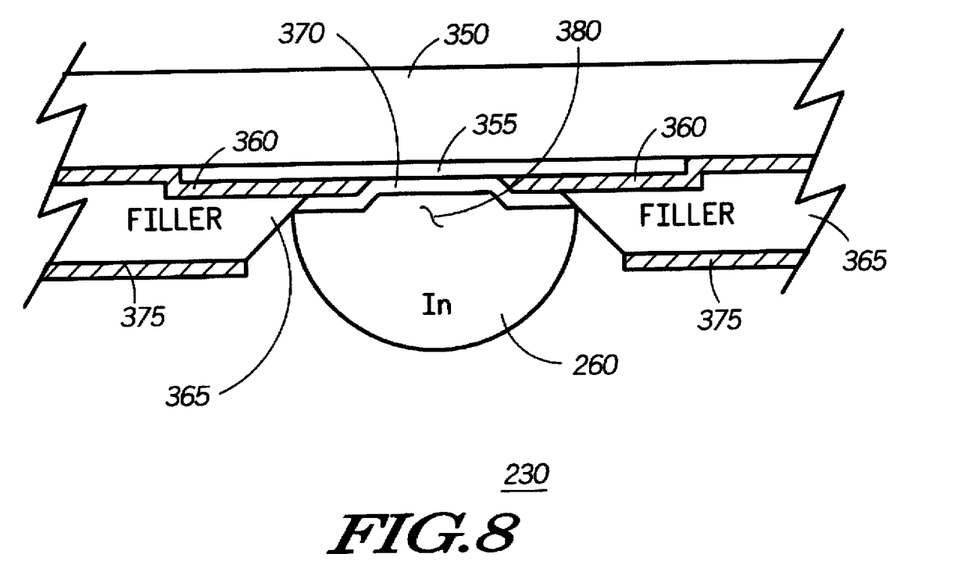
FIG. 8 is a side cutaway view of the IC of FIG. 4 on which glass-adhering conductive bumps are formed in accordance with the present invention.

FIG. 8 is a side cutaway view of an IC, such as the display driver 230, manufactured according to the present invention.

The driver IC 230 comprises an integrated circuit die 350 including the driver circuitry (not shown) for receiving the data signals and generating therefrom the display signals for driving the display region 220 (FIG. 4) of the LCD 215. A redistribution layer 355, formed from a conductive material such as aluminum, is plated on a surface of the IC 230 for electrically coupling to the driver circuitry in a specified location, and a passivation layer 360 covers all but a portion of the redistribution layer 355 in a manner known to one of ordinary skill in the art. A metal layer 370, comprising, for example, layers of chrome, copper, and gold, is formed within a cavity 380 formed in the surface of the IC 230 by a filler material 365, such as polyimide, layered adjacent to the passivation layer 360. The metal layer 370 contacts the redistribution layer 355 at the region left uncovered by the passivation layer 360 for receiving and providing signals to the driver circuitry of the IC 230.

The region where the metal layer 370 contacts the redistribution layer 355 within the cavity 380 is bumped with a conductive bump 260. The conductive bump 260 can be, for example, electroplated into the cavity 380 or deposited in a physical vapor dispersion process, such as sputtering or evaporation. According to the present invention, the conductive bump 260 is formed from pure indium or an indium alloy that adheres to glass when liquefied. For the purpose of improving bonding to glass, materials such as lithium, sodium, calcium, magnesium, potassium, and phosphorus can be alloyed with indium.

It will be appreciated that a single redistribution layer 355, a single metal layer 370, and a single conductive bump 260 are shown for illustrative purposes only and that a redistribution layer, metal layer, and conductive bump will generally be provided for each different signal transmitted to or from the circuitry formed on the die 350.

Indium typically liquefies in a temperature range of 145° centigrade to 180° centigrade. In order to lower the melting temperature of the conductive bumps 260, indium can be alloyed with materials such as tin, bismuth, gallium, and germanium. Also, the indium can be alloyed with common solder alloying elements, such as lead and silver. Most alloying levels would be less than five percent of the weight of the alloy for any one element and less than fifty percent of the weight of the alloy for the total alloyed content. However, for the cases of tin, bismuth, and lead, alloying levels can be considerably higher.

The sizes of the indium or indium alloy conductive bumps 260 depend upon the sizes of the cavities 380 formed in the surface of the IC 230. Preferably, the sizes of the bumps 260 should be adjusted so that the indium is contained within the cavities 380 after connection of the IC 230 to the glass substrate 225 (FIG. 4). According to the present invention, an adhesive 375 is also deposited on the surface of the IC 230 surrounding the cavities 380 in which the bumps 260 are situated. The adhesive 375 preferably contacts the glass substrate 225 when the IC 230 is coupled thereto to provide a mechanical connection that reduces the likelihood of breaking the electrical connections provided by the conductive bumps 260.

Figure 9:
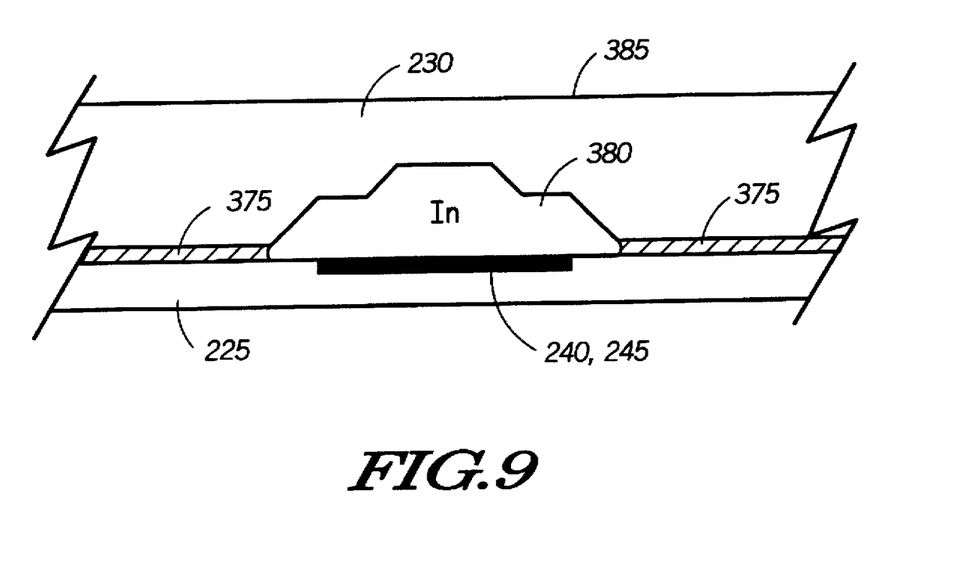
FIG. 9 is a side cutaway view of the IC of FIG. 4 when coupled to the glass substrate of the LCD of FIG. 4 in accordance with the present invention.

Referring next to FIG. 9, a side cutaway view of the IC 230 mounted to the glass substrate 225 is depicted. The IC 230 is preferably coupled to the glass substrate 225 in a bonding process in which heat and pressure are applied to the IC 230. During this process, heat within a predetermined range of temperatures, e.g., 145° centigrade to 180° centigrade for pure indium, liquefies the conductive bumps 260, and pressure is applied to the surface 385 of the IC 230 opposite the conductive bumps 260 to press the adhesive 375 into contact with the glass substrate 225. While liquefied, the indium of the conductive bumps 260 adheres to the glass in locations at which the ITO runners 240, 245 are formed. At completion of the bonding process, the indium or indium alloy of the bumps 260 preferably fills the cavities 380 (FIG. 8) in the IC 230, although it will be appreciated that a greater or lesser amount of indium or indium alloy can be utilized so long as a reliable electrical connection is made to the ITO runners and so long as the amount of the conductive material is not great enough to spread to other cavities and electrically short the IC 230.

According to the present invention, an IC 230 can be mounted directly to a glass substrate 225, such as that of an LCD 215, because conductive regions of the IC 230 are bumped with conductive material that adheres to glass. As a result, the IC 230 can be thermally bonded to the glass substrate 225 directly, without the use of anisotropic films that can be expensive and which can provide unreliable electrical connections. Because the IC 230 is bonded directly to a glass substrate 225 on which ITO runners 240, 245 can be formed at a very fine pitch, less space is consumed within the device 200 housing the IC 230 than if a similar IC is bonded to a conventional pc board 105. Furthermore, because the glass substrate 225 is rigid, a more reliable electrical connection is provided than when a similar IC is bonded to a flexible substrate, such as a heat seal connector, which can be folded and bent. Contributing to the device reliability is an adhesive 375 deposited on the IC 230 for providing additional mechanical strength to prevent breakage of electrical contacts. It will be appreciated, however, that the adhesive 375 could, in other embodiments of the present invention, be dispensed with altogether. Alternatively, when a greater mechanical strength is desired without the use of the adhesive 375, an insulative material could be deposited over the top of the IC 230 to cover the IC 230 and a portion of the glass substrate 225 surrounding it after the IC 230 has been bonded to the substrate 225.

Figure 10:
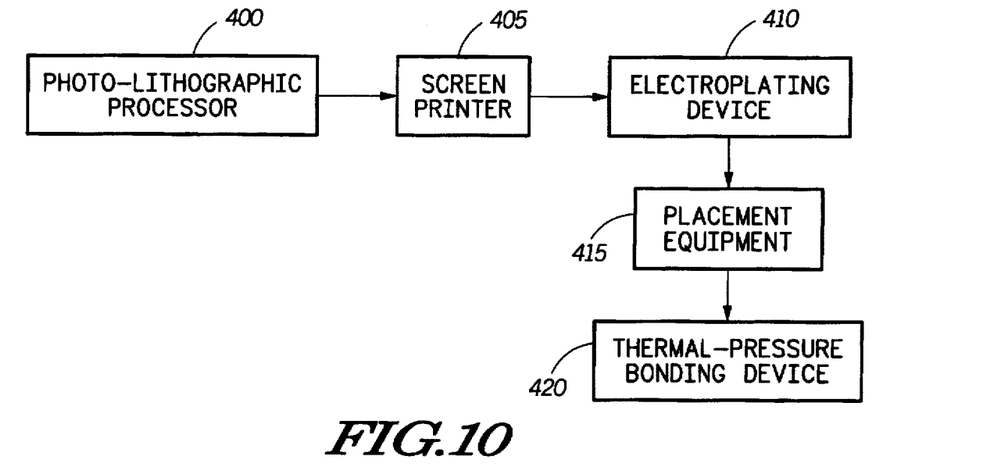
FIG. 10 is a flowchart depicting a process in which the IC of FIG. 4 is manufactured and assembled to the glass substrate of the LCD of FIG. 4 in accordance with the present invention.

FIG. 10 is a flowchart of a manufacturing process by which the IC 230 can be assembled to the glass substrate 225 after manufacture. As mentioned above, the IC 230 can be manufactured in general using conventional C4 techniques. A difference from conventional C4 techniques, however, is that metal layers 370 (FIG. 8) are preferably deposited only within the cavities 380 of the IC 230. The manufactured IC 230 can be processed by a photo-lithographic processor 400 to define areas of the IC 230 in which the adhesive 375 should be placed. Next, the IC 230 is processed by a screen printer 405 to apply the adhesive 375 to the IC 230 in the areas indicated by the photo-lithographic process. An electroplating device 410 can then be utilized to deposit a predetermined amount of indium or indium alloy within the cavities 380 (FIG. 8) of the IC 230 to form the conductive bumps 260. The bumped IC 230 is subsequently positioned by placement equipment 415 on the glass substrate 225 such that the conductive bumps 260 contact the ITO runners 240, 245 formed on the substrate 225. The IC 230 is then processed by a thermal-pressure bonding device 420, as described above, to electrically and mechanically couple the IC 230 to the glass substrate 225.

Figure 11:
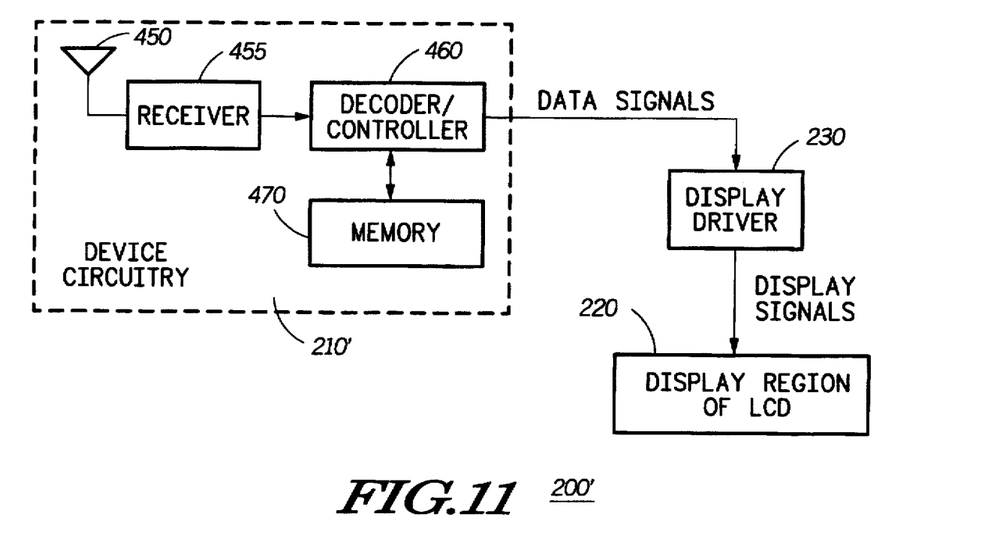
FIG. 11 is an electrical block diagram of an electronic device including the LCD and IC of FIG. 4 in accordance with the present invention.

As mentioned, the IC 230 according to the present invention is particularly useful in the context of smaller electronic devices, such as a radio communication device 200' shown in FIG. 11. The device circuitry 210' of the radio communication device 200' preferably comprises an antenna 450 for receiving radio frequency signals and a receiver 455 for demodulating the signals. The demodulated signals are processed by a decoder/controller 460 to recover information included therein, which is stored in a memory 470. Preferably, the device circuitry 210' is mounted on a pc board (not shown) within the radio communication device 200', and data signals generated thereby are provided to a display driver, such as the driver IC 230, via a connector (not shown). The display driver 230 is electrically coupled to the display portion 220 of the LCD 215. Preferably, the driver IC 230 is mounted directly to the extended glass region, i.e., the glass substrate 225, of the LCD 215. Therefore, only a minimal amount of space is consumed within the radio communication device 200' for placement and connection of the IC 230.

In accordance with an alternate embodiment of the present invention, a conventional IC (not shown) can be adapted for placement directly on a glass substrate by plating conventional conductive bumps of the IC with indium. According to the alternate embodiment, a conventional IC has conventional conductive bumps plated on the metal layers in the cavities of the IC. The conductive bumps are, for example, formed from gold or a gold alloy. Indium or an indium alloy is plated or sputtered over the surfaces of the conductive bumps such that the IC can be mounted on a glass substrate and electrically coupled to ITO runners.

During an assembly process, the IC according to the alternate embodiment of the present invention is aligned with the ITO runners and attached thereto using a combination of heat and pressure. By way of example, the IC and substrate could be subjected to a temperature of approximately 200° centigrade, such as from a hot plate applied to the underside of the glass substrate. Enough pressure could then be applied to the IC to cause the molten indium to flow and bond to the ITO runners on the glass substrate. Subsequently, an epoxy encapsulant could be utilized to seal the areas beneath the IC and between the conductive bumps.

In summary, the electronic device as described above includes device circuitry for generating data signals indicative of information to be displayed. The device further includes a driver circuit, which can be in the form of an IC, for generating display signals from the data signals and a display device, such as an LCD, for displaying the information in accordance with the display signals generated by the driver. According to the present invention, the driver is mounted directly to a glass substrate formed by the extension of the LCD glass past an LCD display region. The driver is coupled to the display region by ITO runners formed on the glass substrate and to the device circuitry by a connector coupled between ITO runners on the glass substrate and a printed circuit board on which the device circuitry is mounted.

The driver IC according to the present invention can be advantageously mounted directly to the glass substrate because the IC is bumped with a material that adheres to glass. Examples of such material are indium or an indium alloy. The indium bumps formed on the IC liquefy when heated and adhere directly to the glass, thereby coupling the IC to the ITO runners formed on the glass. As a result, the IC need not be mounted on the printed circuit board of the electronic device or on a connector for connecting the printed circuit board to the LCD.

ITO runners on glass can be formed at a relatively fine pitch in comparison with runners formed on a flexible substrate, heat seal connector, or printed circuit board. Therefore, the driver IC and printed circuitry utilizes less space when mounted on the glass substrate than would be the case if mounted to a connector or to a printed circuit board. Because less space within the electronic device is consumed by mounting the IC directly to the LCD glass substrate, the IC according to the present invention is particularly useful in portable communications applications, such as pagers, in which space is a critical issue. Furthermore, the IC according to the present invention can be more reliably connected to printed circuitry on the glass substrate than can conventional ICs that are mounted to flexible connectors.

It will be appreciated by now that there has been provided an integrated circuit that can be reliably coupled directly to a glass substrate within an electronic device.

What is claimed is:

1. An integrated circuit (IC) which attaches to a glass substrate, which includes an integrated circuit die comprising circuitry, and which includes cavities formed in a first surface thereof, the IC comprising:

metal layers formed adjacent to the integrated circuit die within the cavities and coupled to the circuitry;

conductive bumps formed within the cavities to electrically couple to the circuitry via the metal layers, the conductive bumps comprising a material that adheres to glass; and an adhesive deposited on regions of the first surface of the IC surrounding the cavities in which the conductive bumps are formed for adhering to the glass substrate when the IC is attached thereto, thereby strengthening the bond provided by connections between the conductive bumps and the glass substrate, wherein the conductive bumps extend farther from the first surface of the IC than does the adhesive.

2. The IC of claim 1, wherein the material from which the conductive bumps are formed comprises indium.

3. The IC of claim 1, wherein the material from which the conductive bumps are formed comprises an indium alloy.

4. The IC of claim 1, wherein the material from which the conductive bumps are formed liquefies in a temperature range of 145° centigrade to 180° centigrade.

5. An electronic device for displaying information to a user, the electronic device comprising:

a display for presenting the information, the display including a glass substrate having conductive runners formed thereon;

an integrated circuit (IC) for attaching to the glass substrate, the IC having cavities formed in a first surface thereof and including an integrated circuit die having circuitry included thereon, the IC comprising:

metal layers formed adjacent to the integrated circuit die within the cavities and coupled to the circuitry;

conductive bumps formed within the cavities to electrically couple to the circuitry via the metal layers, the conductive bumps comprising a material that adheres to glass such that the conductive bumps electrically couple the circuitry to the conductive runners of the glass substrate when heat is applied thereto; and an adhesive deposited on regions of the first surface of the IC surrounding the cavities in which the conductive bumps are formed for adhering to the glass substrate when the IC is attached thereto, thereby strengthening the bond provided by connections between the conductive bumps and the glass substrate, wherein the conductive bumps extend farther from the first surface of the IC than does the adhesive.

6. The electronic device of claim 5, wherein the material from which the conductive bumps are formed comprises indium.

7. The electronic device of claim 5, wherein the material from which the conductive bumps are formed comprises an indium alloy.

8. The electronic device of claim 5, wherein the material from which the conductive bumps are formed liquefies in a temperature range of 145° centigrade to 180° centigrade.

9. The electronic device of claim 5, wherein the IC comprises a display driver for providing display signals to the display to generate presentation of the information.

10. The electronic device of claim 5, further comprising:
a printed circuit board on which device circuitry is mounted for performing operations of the electronic device, the printed circuit board including conductive pads formed thereon; and a connector coupled between the conductive pads of the printed circuit board and the conductive runners formed on the glass substrate for providing electrical signals from the device circuitry to the circuitry of the IC.

11. The electronic device of claim 10, wherein:
the device circuitry includes a receiver for receiving a radio signal and a decoder for recovering a message from the radio signal; and
the IC includes a display driver for providing display signals to the display to generate presentation of the information in accordance with the message decoded by the device circuitry.

* * * * *